US010361326B2

(12) United States Patent
Aulnette et al.

(10) Patent No.: US 10,361,326 B2
(45) Date of Patent: Jul. 23, 2019

(54) ADVANCED CPV SOLAR CELL ASSEMBLY PROCESS

(71) Applicant: Soitec, Crolles (FR)

(72) Inventors: Cécile Aulnette, Lumbin (FR); Rainer Krause, Mainz-Kostheim (DE); Frank Dimroth, Freiburg (DE); Eric Guiot, Goncelin (FR); Eric Mazaleyrat, Crolles (FR); Charlotte Drazek, Grenoble (FR)

(73) Assignee: Soitec, Bernin (FR)

( * ) Notice: Subject to any disclaimer, the term of this patent is extended or adjusted under 35 U.S.C. 154(b) by 240 days.

(21) Appl. No.: 14/780,473

(22) PCT Filed: Mar. 26, 2014

(86) PCT No.: PCT/EP2014/056094
§ 371 (c)(1),
(2) Date: Sep. 25, 2015

(87) PCT Pub. No.: WO2014/154769
PCT Pub. Date: Oct. 2, 2014

(65) Prior Publication Data
US 2016/0056318 A1   Feb. 25, 2016

(30) Foreign Application Priority Data
Mar. 29, 2013 (FR) ...................... 13 52866

(51) Int. Cl.
*H01L 31/0443* (2014.01)
*H01L 31/028* (2006.01)
(Continued)

(52) U.S. Cl.
CPC ...... *H01L 31/0443* (2014.12); *H01L 27/1421* (2013.01); *H01L 31/052* (2013.01);
(Continued)

(58) Field of Classification Search
CPC .................. H01L 27/1421; H01L 31/0443
See application file for complete search history.

(56) References Cited

U.S. PATENT DOCUMENTS 5,009,720 A * 4/1991 Hokuyo .............. H01L 31/0693
136/255
6,278,054 B1 * 8/2001 Ho ........................ H01L 31/046
136/255
(Continued)

FOREIGN PATENT DOCUMENTS

EP        0369666 A2    3/1990
EP        2388825 A2    11/2011
(Continued)

OTHER PUBLICATIONS

Chinese First Office Action for Chinese Application No. 201480030798.2 dated Jun. 2, 2016, 5 pages.
(Continued)

*Primary Examiner* — Sadie White
(74) *Attorney, Agent, or Firm* — TraskBritt (57) ABSTRACT

This disclosure relates to a solar cell assembly structure for supporting a concentrator photovoltaic cell comprising a semiconducting structure and a diode, wherein the semiconducting structure comprises a first semiconducting region at least a part of which for placing the concentrator photovoltaic cell structure, and a second semiconducting region for realizing the diode within or on the second semiconducting region and wherein the part of the first semiconducting region for placing the concentrator photovoltaic cell structure and the second semiconducting region are not vertically overlapping.

26 Claims, 5 Drawing Sheets

(51) Int. Cl.
  *H01L 31/0693* (2012.01)
  *H01L 31/054* (2014.01)
  *H01L 31/0687* (2012.01)
  *H01L 27/142* (2014.01)
  *H01L 31/052* (2014.01)

(52) U.S. Cl.
  CPC .......... *H01L 31/0687* (2013.01); *Y02E 10/52* (2013.01); *Y02E 10/544* (2013.01); *Y02P 70/521* (2015.11)

(56) References Cited

U.S. PATENT DOCUMENTS

| | | | |
|---|---|---|---|
| 7,732,706 | B1 | 6/2010 | Mardesich |
| 8,604,330 | B1* | 12/2013 | Hennessy ............... H01L 31/05 136/201 |
| 2005/0072457 | A1 | 4/2005 | Glenn |
| 2007/0277875 | A1* | 12/2007 | Gadkaree ............ H01L 31/0392 136/256 |
| 2008/0110489 | A1* | 5/2008 | Sepehry-Fard ............................. H01L 21/02395 136/246 |
| 2010/0037935 | A1* | 2/2010 | Vaid .................. H01L 31/02168 136/246 |
| 2010/0243038 | A1 | 9/2010 | Kukulka |
| 2011/0124146 | A1* | 5/2011 | Pitera .................. H01L 31/0687 438/64 |
| 2011/0265851 | A1 | 11/2011 | Wang et al. |
| 2011/0284986 | A1 | 11/2011 | Rim et al. |

FOREIGN PATENT DOCUMENTS

| | | |
|---|---|---|
| JP | 57204180 A | 12/1982 |
| WO | 03012880 A2 | 2/2003 |

OTHER PUBLICATIONS

Chinese Second Office Action for Chinese Application No. 201480030798.2 dated Feb. 8, 2017, 6 pages.
Chinese Office Action and Search Report for Chinese Application No. 201480030798.2 dated Jun. 2, 2016, 6 pages.
International Preliminary Report on Patentability for International Application No. PCT/EP2014/056094 dated Sep. 29, 2015, 6 pages.
International Written Opinion for International Application No. PCT/EP2014/056094 dated Apr. 15, 2014, 5 pages.
French Preliminry Search Report for French Application No. 1352866 dated Oct. 10, 2013, 3 pages.
International Search Report for International Application No. PCT/EP2014/056094 dated Apr. 15, 2014, 4 pages.
Stan et al., Design and Performance of High Efficiency III-V Space Solar Cells with Monolithic Bypass Diode Architecture, Conference Record of the 2006 IEEE 4th World Conference, May 1, 2006, pp. 1865-1868.

* cited by examiner

ADVANCED CPV SOLAR CELL ASSEMBLY PROCESS

CROSS-REFERENCE TO RELATED APPLICATIONS

This application is a national phase entry under 35 U.S.C. § 371 of International Patent Application PCT/EP2014/056094, filed Mar. 26, 2014, designating the United States of America and published in English as International Patent Publication WO 2014/154769 A1 on Oct. 2, 2014, which claims the benefit under Article 8 of the Patent Cooperation Treaty and under 35 U.S.C. § 119(e) to French Patent Application Serial No. 1352866, filed Mar. 29, 2013, the disclosure of each of which is hereby incorporated herein in its entirety by this reference.

TECHNICAL FIELD

This disclosure generally relates to the field of photovoltaic electricity generators. In particular, it relates to a semiconductor structure and a solar cell assembly.

BACKGROUND

In recent years due to the cost increase associated with producing electricity from fossil fuels, renewable energy technology has gained interest. In particular, among the plurality of renewable energy technologies, Concentrator Photovoltaic (CPV) technology has been the subject of much research. The advantage of CPV over the non-concentrator photovoltaic technology results from the fact that CPV can produce the same amount of electricity as a much larger non-concentrator photovoltaic cell, by focusing the sunlight via a lens on a smaller active semiconductor area. Thanks to this approach, it is possible to reduce the costs associated with the manufacturing of the photovoltaic cell since the amount of materials used is reduced.

However, by concentrating the sunlight in such a manner, CPV systems have a tendency to increase their temperature during operation. This negatively affects the efficiency of the photovoltaic conversion. Accordingly, it is often necessary to position CPV cells on top of structures capable of removing excessive heat from the cells such as passive or active heat sinks.

Additionally, it is customary to place several CPV cells in series. In this case, it is further customary to connect a bypass diode to each of the cells so as to avoid reverse voltages, when only some of the series-connected cells are illuminated by sunlight, which can result in damage to the cell.

Figure 4A:
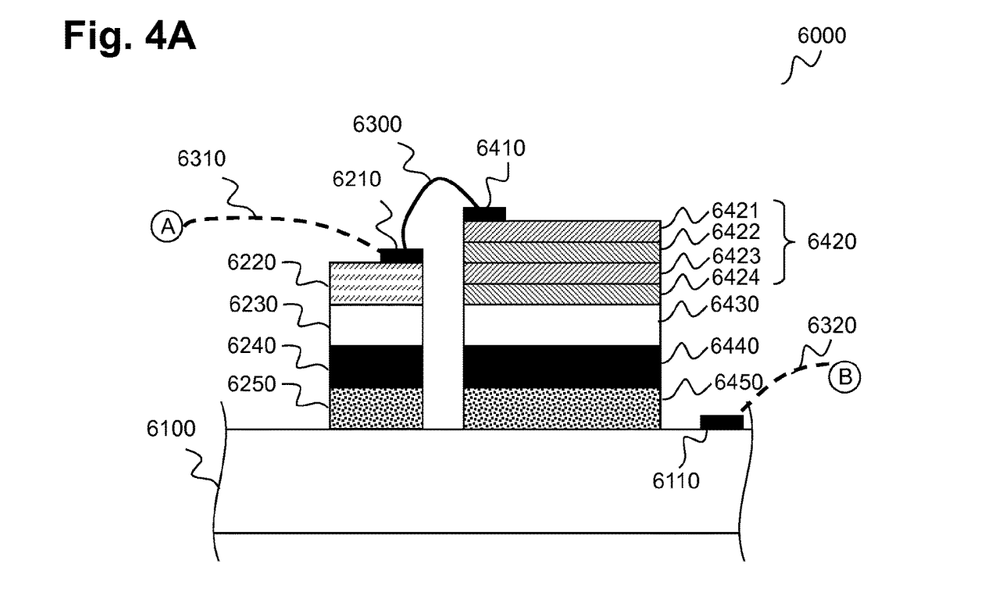
FIGS. 4A and 4B illustrate a solar cell assembly 6000, according to the state of the art.

Those two requirements, the placement of the CPV cells on a heat sink and the connection of a bypass diode to each CPV cell, can be solved by the structure represented in FIG. 4A.

Figure 4B:
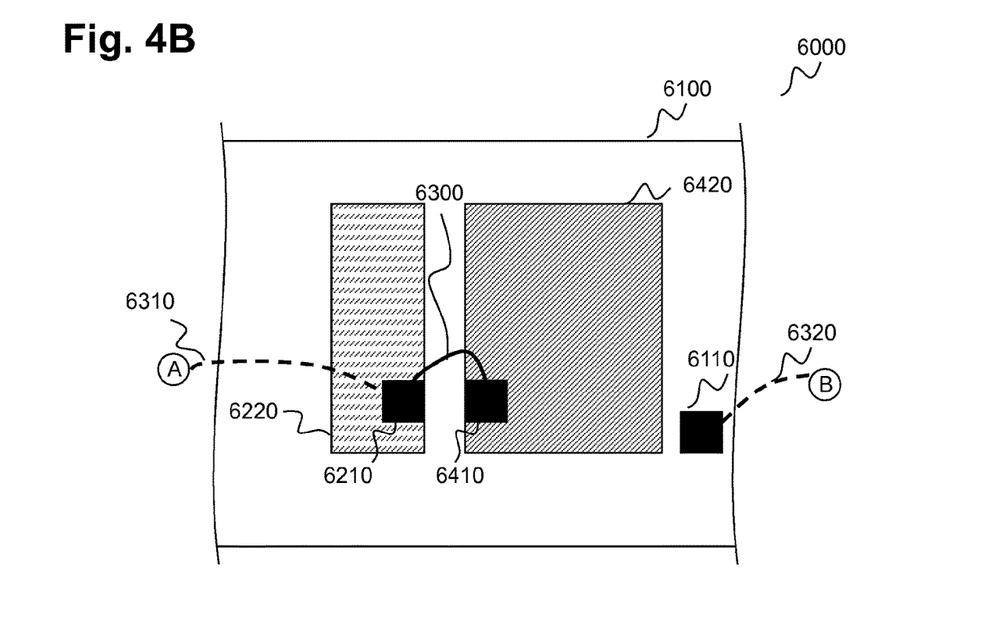

In particular, FIG. 4A illustrates a cross-sectional view of a solar cell assembly 6000, while FIG. 4B illustrates a top view of the same solar cell assembly. More specifically, the solar cell assembly 6000 comprises a heat sink 6100 made of thermally and electrically conductive material on top of which a photovoltaic cell 6420 is mounted. The photovoltaic cell 6420 comprises a plurality of semiconductor layers, schematically represented as stacked layers 6421-6424, for instance, a plurality of p-doped and n-doped layers. In particular, the photovoltaic cell 6420 can be a III-V concentrator photovoltaic cell. The solar cell assembly 6000 further comprises diode 6220.

Both diode 6220 and photovoltaic cell 6420 are positioned on, from top to bottom, a substrate 6230, 6430, a metal contact 6240, 6440, and an electrically and thermally conductive glue, solder paste or adhesive layer 6250, 6450, respectively. Further, both diode 6220 and photovoltaic cell 6420 comprise a front contact 6210, 6410, respectively, on their upper surface. An electrical back contact of both diode 6220 and photovoltaic cell 6420 are made through the substrate 6230, 6430, the metal contact 6240, 6440, the glue layer 6250, 6450 to the electrically conductive heat sink 6100.

In each diode-photovoltaic cell couple, the diode 6220 and photovoltaic cell 6420 are connected in an antiparallel manner. One connection is achieved via a wirebond connection 6300 between front contacts 6210 and 6410. The remaining connection is achieved through the heat sink 6100. The heat sink 6100 is electrically conductive in order to be able to report the back contact to the electrical contact pad 6110. As an example, a standard Ge/GaAs/InGaP multi-junction solar cell utilizes an electrically conductive Ge substrate on which the other junctions are grown by epitaxy. Additionally, the diode 6220 and photovoltaic cell 6420 are connected to neighboring diode-photovoltaic cell couples by wirebond connections 6310 and 6320. In particular, point A of a first couple is connected to point B of a second couple and so on, so as to realize a series connection of a plurality of diode-photovoltaic cell couples.

This arrangement requires all layers 6230-6250 and 6430-6450 to be electrically conductive. Additionally, all those layers must be thermally conductive as well, since heat has to be dissipated, mostly from the photovoltaic cell 6420, via the different elements, into the heat sink 6100. Still further, the solar cell assembly realized in this manner is costly since the photovoltaic cell 6420 and the diode 6220 are provided as separate elements, and many individual manufacturing steps are required, for instance, pick-and-place processes for each cell and each diode.

Patent document US 2010/0243038 discloses (cf. FIG. 1) a solar cell assembly 10 in which a substrate 12 is used as a carrier for a multi junction solar cell 20. The top of the substrate 12 comprises a diode 18 and the solar cell 20 is attached to the substrate 12 via a conductive bonding material 34, such as silicone, epoxy, solder or braze (cf. paragraph [0030]).

However, this does not solve the above-mentioned problems, as the bonding material 34 presents, as layers 6230-6250 and 6430-6450, both an electrical and thermal resistance. Further, the positioning of the diode 18 along the entire top surface of substrate 12 renders the placement of contacts 42, 40 and 46 difficult for manufacturing. In particular, contact 40 exposed from substrate 12 cannot be realized with standard semiconductor technology. Additionally, connection to contact 42 on the back side of substrate 12 is difficult. Even further, if the substrate 12 is mounted on a heat sink, contact 42 is electrically connected to the heat sink, which may be undesirable in some cases.

BRIEF SUMMARY

An embodiment of this disclosure can relate to a solar cell assembly structure for supporting a concentrator photovoltaic cell structure, comprising a semiconducting structure and a diode, wherein the semiconducting structure comprises: a first semiconducting region, at least a part of which is for placing the concentrator photovoltaic cell structure, and a second semiconducting region, for realizing the diode within or on the second region, the first and second semiconducting regions are not vertically overlapping.

In some embodiments, the solar cell assembly structure can further comprise an electrical contact pad, wherein the first semiconducting region is electrically contacting the second semiconducting region for realizing a low resistance contact between the diode, the placing of the concentrator photovoltaic cell and the contact pad.

In some embodiments, the first and second semiconducting regions can be made of semiconducting material, in particular, Si, Ge, and SiGe.

In some embodiments, the semiconductor structure can further comprise an electrically conductive substrate electrically connecting the first and second regions, in particular, the electrically conductive substrate is made of metallic material, in particular, Mo or W.

In some embodiments, the first semiconducting region can be highly doped, n-type or p-type, in particular, with dopant concentration greater than $1E18$ $cm^{-3}$.

In some embodiments, the diode can comprise a first doped region and a second doped region, wherein the first and second doped regions have different polarity.

In some embodiments, the polarity of the diode can be p-type or n-type, with a positive pole contacting a front contact and a negative pole contacting the first semiconducting region.

In some embodiments, the first semiconducting region of the semiconductor structure can have the same type of doping as the second doped region of the diode.

In some embodiments, the first and/or second doped regions can be realized via diffusion doping and/or epitaxial growth.

Further, an embodiment of this disclosure can relate to a solar cell assembly comprising the solar cell assembly structure according to any previous embodiment and a concentrator photovoltaic cell structure assembled thereon, wherein the concentrator photovoltaic cell structure is assembled on the part of the first semiconducting region for placing the concentrator photovoltaic cell structure.

In some embodiments, the concentrator photovoltaic cell and the diode can be bonded on the first and second semiconducting regions, respectively, in particular, using molecular or direct bonding, thermal compression bonding, or metallic bonding.

In some embodiments, the diode can be connected in an antiparallel manner to the concentrator photovoltaic cell structure.

In some embodiments, the concentrator photovoltaic cell structure can be a multi junction cell made of III-V compound semiconductors, in particular, InGaAs, InGaAsP, GaAs, and InGaP.

In some embodiments, the concentrator photovoltaic cell structure can have a thickness lower than 10 μm.

In some embodiments, the concentrator photovoltaic cell structure can comprise a bottom layer made of p-doped material and the first semiconducting region is p-doped, and molecular bonding is realized between the p-doped bottom layer and the first semiconducting region, and is a p-p bonding type.

In some embodiments, the concentrator photovoltaic cell structure can comprise a top layer made of n-doped material and a bottom layer made of p-doped material and further comprises a p-n tunnel diode realized on the bottom layer, the first semiconducting region is n-doped, and wherein molecular bonding is realized between the free n-doped face of the tunnel diode and the first semiconducting region and is an n-n bonding type.

In some embodiments, an area ratio between the solar cell assembly structure and the concentrator photovoltaic cell structure can be in the range from 1.2 to 1, to 10 to 1, preferentially from 2 to 1 to 4 to 1.

In some embodiments, the solar cell assembly can further be mounted on a heat sink via an adhesive.

An embodiment of the present invention can further relate to a plurality of solar cell assembly structures according to any previous embodiment realized on a wafer with a preferable diameter of 2 inches, 4 inches, 6 inches, 8 inches, 11 inches, or 400 cm, preferentially made of silicon or silicon on molybdenum.

BRIEF DESCRIPTION OF THE DRAWINGS

The disclosure will be described in more detail, by way of example, hereinafter using advantageous embodiments and with reference to the drawings. The described embodiments are only possible configurations in which the individual features may, however, as described above, be implemented independently of each other or may be omitted. Equal elements illustrated in the drawings are provided with equal reference signs. Parts of the description relating to equal elements illustrated in the different drawings may be left out. In the drawings.

DETAILED DESCRIPTION

This disclosure will now be described with reference to specific embodiments. It will be apparent to the skilled person that features and alternatives from any of the embodiments can be combined, independently of each other, with features and alternatives of any other embodiment.

Figure 1A:
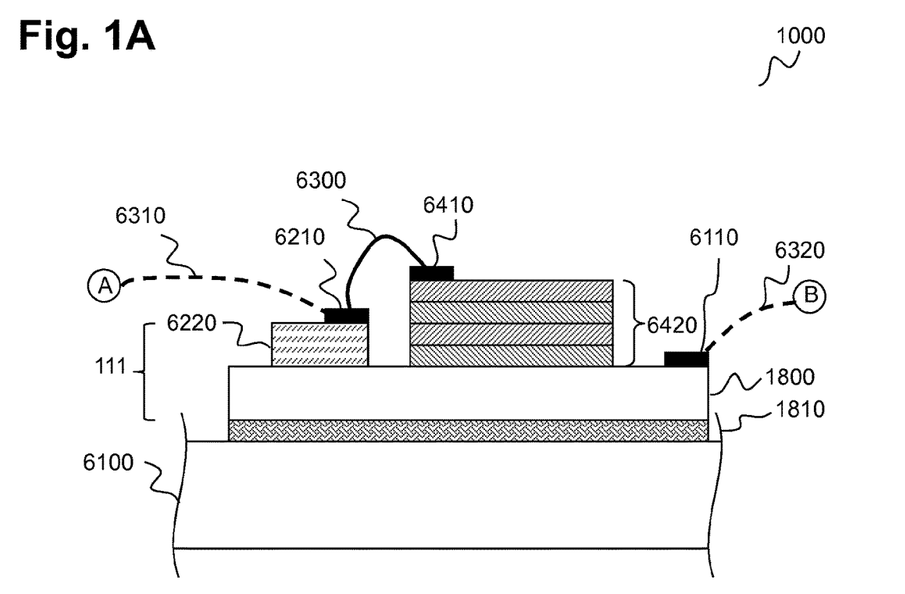
FIGS. 1A to 1C illustrate a solar cell assembly structure 111, a solar cell assembly 1000 and the realization of solar cell assembly structures 111 in accordance with embodiments of this disclosure.
Figure 1B:
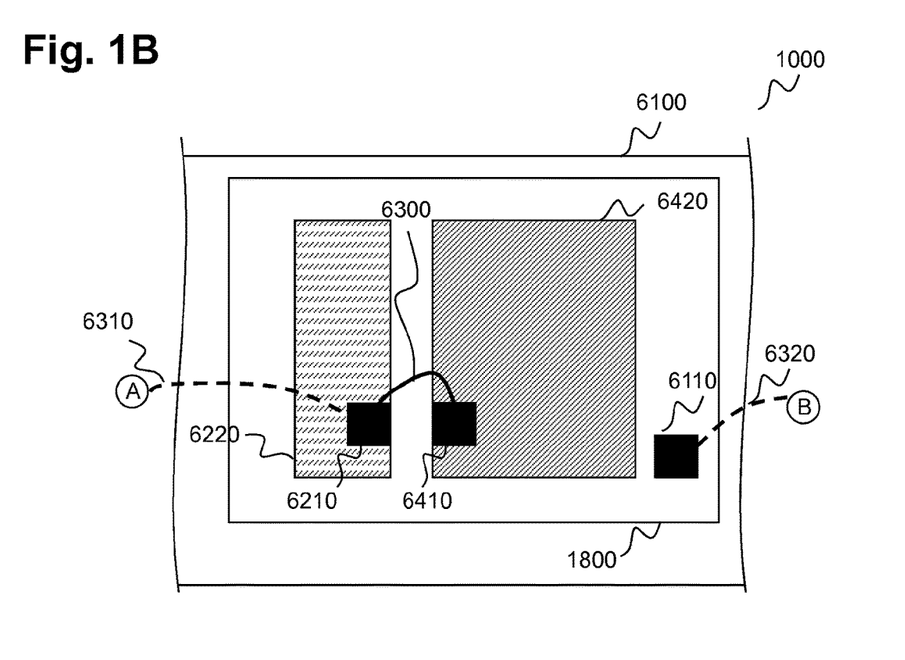

In particular, FIGS. 1A and 1B respectively illustrate a cross-sectional view and a top view of a solar cell assembly 1000 and a solar cell assembly structure 111 in accordance with embodiments of this disclosure.

More specifically, in FIG. 1A, the diode 6220, which is a full diode or only a part of the diode, and photovoltaic cell 6420 are directly bonded onto a semiconductor structure 1800. The direct bonding can be achieved in several manners by using standard semiconductor technology, such as molecular bonding or direct bonding, laser welding, thermal compression bonding, metal bonding, etc. For the latter, metal layers (not illustrated in FIG. 1A) are provided between the photovoltaic cell 6420 and the semiconductor structure 1800, as well as between the diode 6220 and the semiconductor structure 1800. In particular, the photovoltaic cell is bonded on a first semiconducting region of the semiconductor structure 1800. Similarly, the diode is bonded on a second semiconducting region of the semiconductor structure 1800. The first region and the second region so defined are part of the broader semiconducting region formed by semiconductor structure 1800, and are not vertically overlapping. The diode is thus located beside the photovoltaic cell and not arranged on top or below the photovoltaic cell. The solar cell assembly structure 111 comprises the semiconductor structure 1800 and the diode 6220.

Electrical contact pad 6110 is realized on semiconductor structure 1800 rather than heat sink 6100. For instance, the contact pad 6110 could be placed on the back side of the semiconductor structure, however, it is more preferential to realize all the contacts, in particular, contact pad 6110, on the front side, allowing easier connection to other solar cell assemblies. The contact could be realized, similarly to contacts 6210, 6410, by metal deposition, patterning, printing, etc. The diode 6220 acts as a protection against reverse currents that could occasionally flow through the photovoltaic cell 6420 and damage the latter, and both the diode 6220 and the photovoltaic cell 6420 are said to have opposite polarity or also commonly known to be connected in an antiparallel manner.

Semiconductor structure 1800 or solar cell assembly structure 111 can have a lateral dimension in the range from 2 mm by 2 mm, up to 50 mm by 50 mm. The vertical dimension of the semiconductor structure 1800 or solar cell assembly structure 111 can be in the range 0.05 mm to 2 mm. Semiconductor structure 1800 can be realized in any of silicon, SiGe, Ge, or any semiconductor-on-metal or metal compounds substrate, in particular, silicon-on-molybdenum or tungsten, and any combinations thereof, as also described, for instance, with respect to FIG. 3A.

The advantage of such structure consists in the fact that the layers 6240, 6250 as well as 6440, 6450 shown in FIG. 4A with reference to the prior art, are removed and replaced by the bonding. This improves the electrical conduction from the back contact of the diode 6220 to the back contact of the photovoltaic cell 6420. Additionally, the heat transfer is also improved, since the heat has to go through less material. Still further, heat dissipation is improved as the semiconductor structure 1800 acts as a heat spreader, resulting in a better dissipation of heat into the heat sink 6100. Further, above-mentioned bonding techniques, in particular, direct bonding, allow a more careful handling of the photovoltaic cells in contrast to other manufacturing techniques like pick-and-place. This is schematically represented by the absence of the substrate layers 6230 and 6430 in FIG. 1A. Advantageous embodiments thus allow the use of thin multi-junction solar cells with thicknesses in the micrometer range, in particular, below 10 μm, for instance, directly bonded to semiconductor structure 1800. Such bonding techniques are only possible on adequate target substrates with low surface roughness as is the case for the above-mentioned semiconductor structure 1800, the surface of which could be easily prepared by etching or polishing techniques.

Figure 1C:
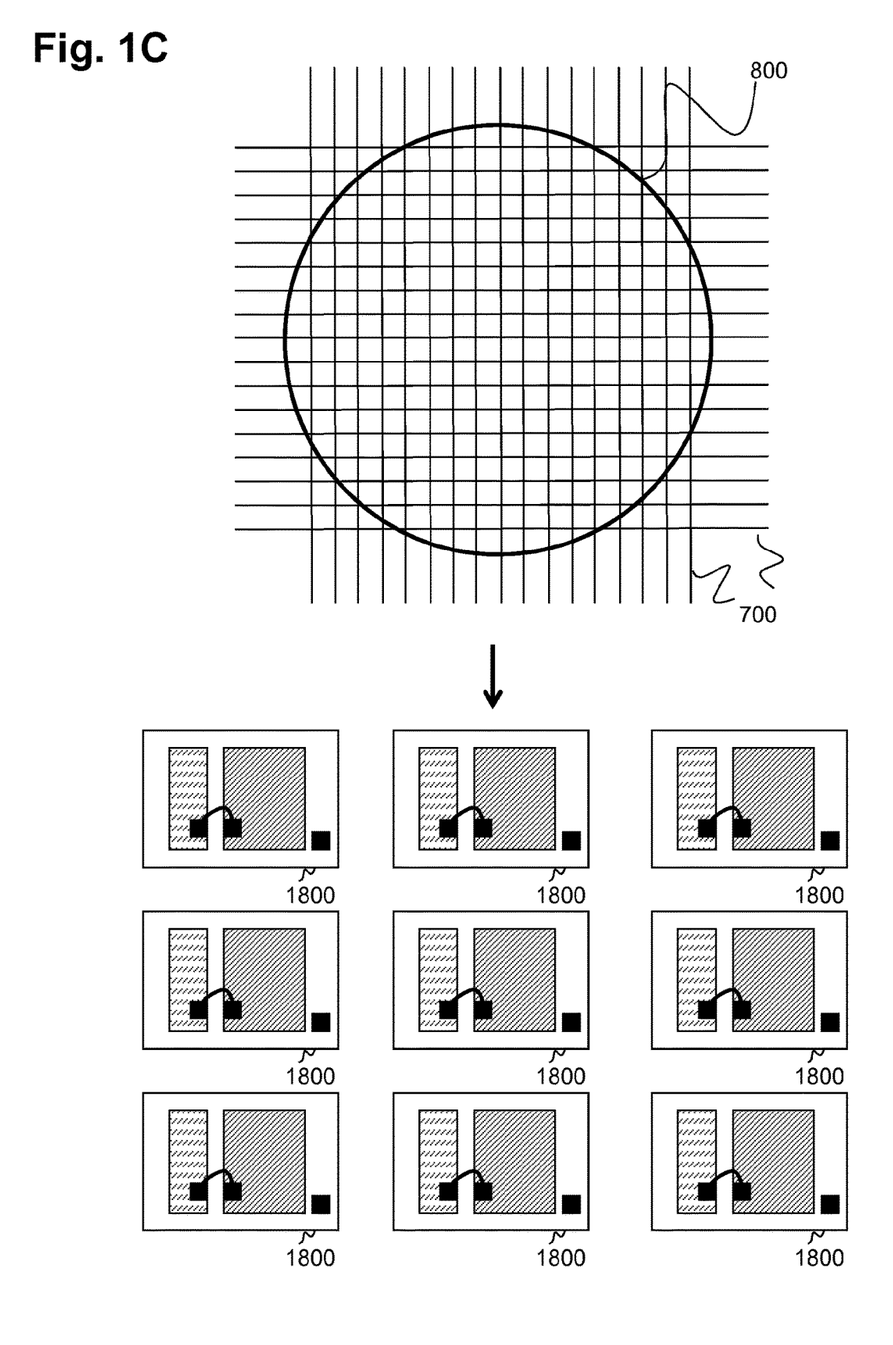

The semiconductor structure 1800 or solar cell assembly structure 111 may be mounted on the heat sink 6100 via an adhesive 1810 if the heat transfer through the semiconductor structure 1800 alone is not sufficient. However, contrary to the case of FIG. 4A, adhesive 1810 does not necessarily have to be electrically conductive, but only thermally conductive and, thus, only this parameter has to be optimized. Accordingly, it is possible to select from a wider range of materials, in particular, thermal adhesive, glue or grease, for instance, like silicone thermal compound or carbon-containing glues, resulting in further improvements of the heat transfer into the heat sink 6100, reducing thermal strain accompanied by increased reliability and lower cost. This means the solar cell assembly 1000 can be realized such that there is no electrical connection between the heat sink 6100 and the diode 6220 and photovoltaic cell 6420, for instance, by using an electrically insulating adhesive 1810. This provides the further advantage that a single heat sink 6100 can be used as basis for a plurality of solar cell assemblies 1000. The semiconductor structure 1800, together with the photovoltaic cell 6420, the diode 6220, and the respective contacts 6210, 6410, and 6110, is a finalized, electrically addressable solar cell assembly even before separation of the individual semiconductor structures 1800 at wafer level, as shown in FIG. 1C, and mounting to the heat sink 6100. This provides the advantage that such solar cell assemblies are able to be electrically tested prior to a final mounting to the heat sink 6100 and in the solar cell module, allowing one to be able to sort out specific, in particular, deficient, solar cell assemblies, thereby increasing overall yield and longevity of the solar cell module.

Although the embodiment of FIGS. 1A and 1B has been illustrated with a diode 6220 directly bonded to the semiconductor structure 1800, this disclosure is not limited thereto. Alternatively, or in addition, the diode 6220 could be realized on the stack of layers 6230, 6240, 6250, as in FIG. 4A, in cases where heat dissipation from the diode 6220 is less critical than heat dissipation from the photovoltaic cell 6420 and/or when electrical connection to the diode is not critical. The back contact of the photovoltaic cell 6420 and the diode 6220 is assured by the doping of the semiconductor structure 1800, which electrically contacts the contact pad 6110, such as, for instance, by extension underneath the electrical contact pad 6110 in FIG. 1A.

Still alternatively, or in addition, the diode could be realized within semiconductor structure 1800, as will be described with reference to FIG. 2, forming solar cell assembly structure 222. Still alternatively, the diode could be realized partially within and partially outside of the semiconductor structure 1800. For instance, this could be achieved by having a first type of doping outside of the semiconductor structure 1800 and a second, opposite, type of doping within the semiconductor structure 1800. The part of the diode realized outside of the semiconductor structure 1800 could be achieved by appropriate epitaxial growth or by already-mentioned bonding techniques; and the part of the diode realized within the semiconductor structure 1800 could be achieved by appropriate doping, for instance, diffusion doping.

It is clear to those skilled in the art that any change of polarity of the photovoltaic cell structure 6420 or the diode 6220 from n-type over p-type to p-type over n-type is possible as long as the opposite polarity of the solar cell and bypass diode are maintained. Tunnel diodes below the photovoltaic cell structure 3420 or below the diode 2220 can be used to make an ohmic contact between an n-type and p-type semiconductor layer.

The semiconductor structure 1800 shown in FIGS. 1A and 1B can be part of a larger wafer 800 as shown schematically in FIG. 1C, in particular, a silicon wafer of standard sizes, in particular, 6-inch, 8-inch, or 12-inch silicon wafers. The use of well-controlled processes known to semiconductor technology like epitaxial growth or diffusion doping allow the fabrication of a large number of semiconductor structures 1800 at the same time on such a wafer 800 in a cost-efficient and economical process, which is not yet possible with state-of-the-art solar cell assembly manufacturing. FIG. 1C schematically illustrates cutting lines 700. The cut could be achieved by etching, diamond cut, sawing, laser separation, or any other technique used in the field of semiconductor technology. One obtains a plurality of semiconductor structures 1800 or solar cell assembly structures 111. It is further possible to assemble the photovoltaic cells 6420 on the wafer 800 by, for instance, a multiple transfer process, before or after the cutting or separation of wafer 800. Such a process allows the assembly of photovoltaic cells on a silicon-based functionalized semiconductor structure on wafer level, allowing preparation of a huge number of solar cell assemblies, each of which is electrically fully addressable and testable, in a parallel and simultaneous way.

Figure 2:
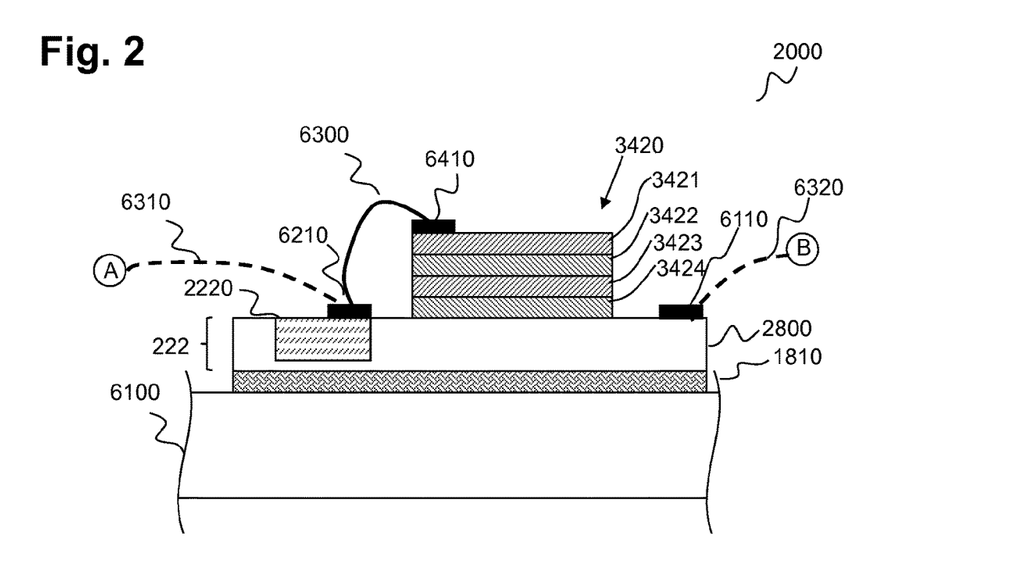
FIG. 2 illustrates a solar cell assembly 2000 and a solar cell assembly structure 222 in accordance with further embodiments of this disclosure.

In particular, FIG. 2 illustrates a cross-sectional view of solar cell assembly 2000 and a solar cell assembly structure 222 in accordance with further embodiments of the present invention.

In particular, in FIG. 2, the photovoltaic cell 6420 of the embodiment of FIG. 1A is replaced by photovoltaic cell 3420. Photovoltaic cell 3420 is a multi-junction photovoltaic cell, in particular, a III-V concentrator photovoltaic cell, comprising a plurality of layers 3421-3424. The layers are stacked so as to realize a plurality of photoactive layers or p-n junctions in series. The number of photoactive layers (full CPV junctions) is preferably comprised in the range of 3 to 6, but not limited thereto. The layers 3421-3424 could comprise photoactive layers of GaInP, GaAs, AlGaAs, GaInAs, and GaInAsP or GaInNAs and Ge, connected by adequate tunnel diodes. Additional barrier layers may be comprised between the photoactive pn junctions and the tunnel diodes as part of the photovoltaic cell 3420. Even more specifically, the doping type of the bottom layer 3424 is chosen so as to form a low ohmic resistance to the semiconductor structure 2800. For instance, if semiconductor structure 2800 is an n-type silicon layer, the doping of the bottom layer 3424 may also be of n-type. In this manner, the direct bonding of the bottom layer 3424 on the semiconductor structure 2800 is improved. However, the disclosure is not limited to this. For instance, if necessary, the bottom layer 3424 may be of p-type and the semiconductor structure of n-type. Hereby, an additional surface activation of the surface of the semiconductor substrate may create a suitable tunnel diode behavior in between the two contacting surfaces. Additionally, in some embodiments, the polarity of the bottom layer 3424 can be selected as p- or n-type by introducing an additional extra tunnel diode if necessary. Semiconductor structure 2800 and the first and second regions are sufficiently doped in order to assure a good electrical contact between the back side of the photovoltaic cell 3420 and the diode 2220, and also electrical contact pad 6110.

Semiconductor structure 2800 or solar cell assembly structure 222 can have a lateral dimension in the range from 2 mm by 2 mm, up to 50 mm by 50 mm. The vertical dimension of the semiconductor structure 2800 or solar cell assembly structure 222 can be in the range from 0.05 mm to 2 mm. Semiconductor structure 2800 can be realized in any of silicon, SiGe, Ge, or any semiconductor-on-metal or metal compounds substrate, in particular, silicon-on-molybdenum or tungsten, and any combinations thereof, as also described, for instance, with respect to FIG. 3A.

More specifically, in FIG. 2, the diode 6220 of FIGS. 1A and 1B is replaced by diode 2220, which is realized within the semiconductor structure 2800. In this case, the first semiconducting region of semiconductor structure 2800 surrounding diode 2220 corresponds to the second semiconducting region of semiconductor structure 1800 below diode 6220 defined above, with reference to the description of FIG. 1A, while the part of semiconductor structure 2800 at least overlapping with the bottom side of the photovoltaic cell 3420 corresponds to the above-defined first semiconducting region of semiconductor structure 1800 below photovoltaic cell 6420, as already defined above, with reference to the description of FIG. 1A.

Here, as well as in the rest of the description, the term diode is to be interpreted generally. Accordingly, the diode 2220 can be realized by providing a doping of the region identified by reference numeral 2220, which is opposite to the doping of the rest of semiconductor structure 2800. For instance, the semiconductor structure 2800 could be doped with an n-type doping, while the diode 2220, which may require two polarities, could be doped with a p-type doping or vice-versa. Alternatively, the diode could be realized by providing both a p-type and an n-type doping, thereby realizing a p-n junction diode, in the region identified by reference numeral 2220. Still alternatively or in addition, the diode could be realized by a metal-semiconductor contact, for instance, by placing metal on the region identified by reference numeral 2220. In the following, for ease of description, all these and equivalent diode technology alternatives will be referred to as diode 2220. For instance, in FIGS. 2A-2C, three possible realizations of the diode 2220 are shown.

Figure 2A:
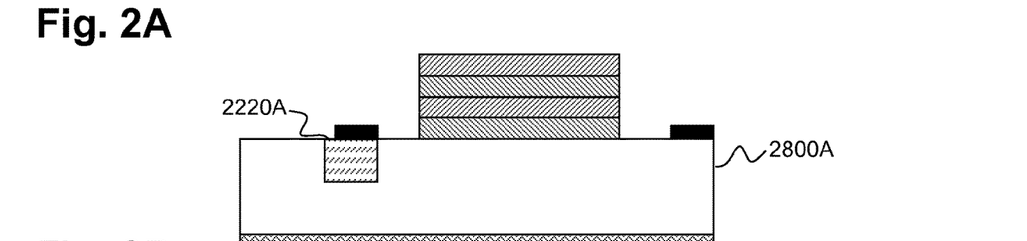
FIGS. 2A-2C illustrate possible realizations of the diode 2220 in accordance with further embodiments of this disclosure.

In FIG. 2A, the diode comprises a first doped region 2220A, which could be low p-doped, in particular, with values up to $1E17$ cm$^{-3}$, or high p-doped, in particular, with values greater than $1E17$ cm$^{-3}$. This first doped region 2220A contacting the high n-doping, in particular, with values greater than $1E18$ cm$^{-3}$, of the doped region 2800A provides a diode 2220 around that contact region. Highly doped region 2800A further not only provides the back contact to the photovoltaic cell 3420 but also assures the electrical contact to electrical contact pad 6110. The values of the low doping regions may be comprised between $5E15$ up to $1E17$ cm$^{-3}$ and the values of the high doping regions may be comprised between $1E17$ and $5E20$ cm$^{-3}$. The actual used values depend on the involved distances in the solar cell assembly structure 222 between cell and diode, and further also depend on the electrical characteristics of the cell. Simulations are used to predetermine these values for the envisaged architecture.

Figure 2B:
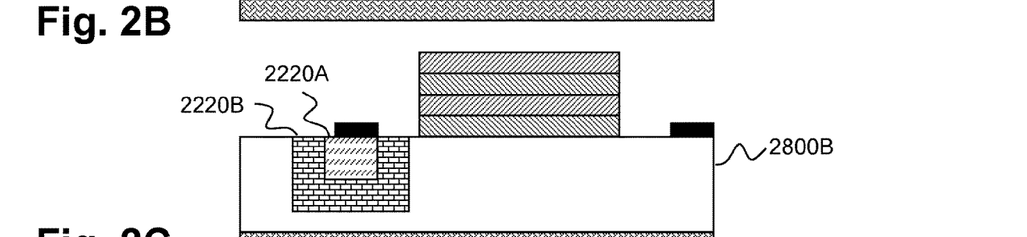

In FIG. 2B, a low n-doped region 2220B surrounds the p-doped region 2220A. The values for the doping may be similar to those disclosed with reference to FIG. 2A. The contact region of regions 2220A and 2220B provides diode 2220. Here, a third doped region 2800B as an electrically conductive part of the first semiconducting region could be highly n-doped, in particular, with values greater than $1E18$ cm$^{-3}$, assuring a low ohmic back contact to electrical contact pad 6110 and the photovoltaic cell 3420. The advantage of this configuration is that the low n-doping of doped region 2220B provides a low reverse current of the diode 2220 and the performance of the cell is not impacted by the diode. Here, the above-defined second region is the combination of doped region 2220B and doped region 2220A.

Figure 2C:
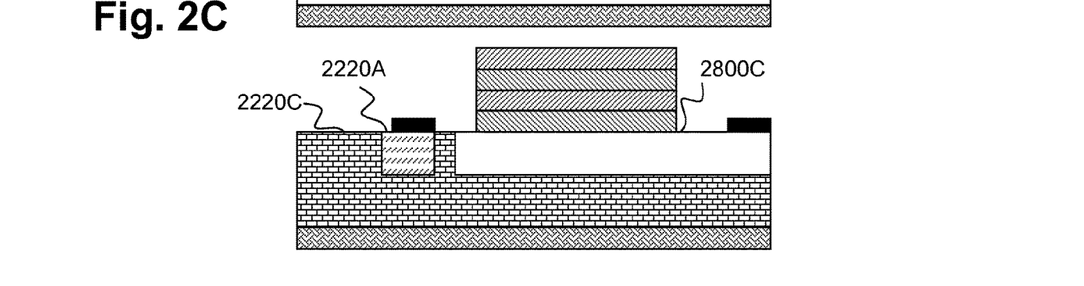

FIG. 2C illustrates a further embodiment in which the doped region 2220B is enlarged into a doped region 2220C, extending over the semiconductor structure 2800 except for the presence of a third doped region 2800C, acting as an electrically conductive part of the first semiconducting region that electrically connects the first and second semiconducting regions, on the surface substantially interfacing with the photovoltaic cell 3420 and electrical contact pad 6110, and, thus, doped region 2800C acting as doped region 2800B. The values for the doping may be similar to those disclosed with reference to FIG. 2A. Here, the above-defined first semiconducting region corresponds to the part of doped region 2800C, which overlaps with the bottom side of the photovoltaic cell 3420, while the second semiconducting region corresponds to the contact region between doped regions 2220A and 2220C.

In the three realizations of FIGS. 2A-2C, the top-most layer 3421 of photovoltaic cell 3420 can be n-doped. This would result in the bottom-most layer 3424 being p-doped. In order to avoid a p-n connection between layer 3424 and doped regions 2800A, 2800B, 2800C, in additional embodiments of this disclosure, an additional tunnel diode (not illustrated) can be used within layer 3424 to alter the polarity of the bottom layer 3424 to be n-type. In particular, the tunnel diode with a p-doped face facing photovoltaic cell 3420 and an n-doped face facing doped regions 2800A, 2800B, 2800C results in an n-n bonding on the side of doped regions 2800A, 2800B, 2800C. Direct bonding between layers of equivalent type of doping is favorable compared to the bonding of layers with different types of doping. Moreover, the additional tunnel diode does not introduce optical losses as it is placed on the back side of the photoactive pn-junction and one has a much larger choice of materials that can be used as optical absorption in any range of wavelength, in particular, ranges for which the photoactive layers would absorb, need not be avoided anymore. In general, an antiparallel connection between the cell and the diode is established, such as, for instance, obtained by the use of a p-doped region 2220A together with an n-doped region 2800A, 2800B, 2800C, 2220B, or 2220C.

It is clear to those skilled in the art that any change of polarity inside the photovoltaic cell 3420 or the diode 2220 from n/p to p/n is possible as long as the opposite polarity of the solar cell and bypass diode are maintained. A tunnel diode below the photovoltaic cell 3420 can be used to make an ohmic contact between an n-type and p-type semiconductor layer.

All of the above-mentioned realizations can, as will be clear to those skilled in the art, be combined in several manners.

In general, the diode 2220 could be realized by doping the semiconductor structure 2800 with P, Sb, As (for instance, for the n-type in Si) or B, Ga, In (for instance, for the p-type in Si) with a concentration in the range of 5E15 to 5E20 cm$^{-3}$. The realization of diode 2220 within semiconductor structure 2800 could be realized by semiconductor technology processing, by processing the semiconductor structure 2800 alone, before joining it to the other elements of solar cell assembly 2000.

Thus, instead of realizing the diode 6220 independently and then assembling it on heat sink, as in FIG. 4A, or on the semiconductor structure 1800, as in FIG. 1A, the diode 2220 can be realized directly on or as part of semiconductor structure 2800. This provides the possibility to realize a large number of diodes in parallel, for instance, on the larger wafer 800 schematically shown in FIG. 1C, thereby increasing the efficiency and the output of the manufacturing process and reducing costs.

Additionally, as can be seen in FIG. 2, the diode 2220 is placed on the side of photovoltaic cell 3420. In other words, the diode 2220 and the photovoltaic cell 3420 may be not vertically overlapping. This is also valid for the contact regions defining the diode 2220 in the embodiments described with reference to FIGS. 2A to 2C. More generally, the diode 2220 is placed such that a connection between the top surface of the diode 2220 and the top surface of the photovoltaic cell 3420, for instance, via contacts 6210 and 6410 and wirebond connection 6300, is possible. In contrast to the prior art identified above, this provides the beneficial advantage that no electrical connection is required on the back side of the semiconductor structure 2800. On the other hand, the electrical connection to neighboring solar cell assembly 2000 can be carried out by electrically connecting to contacts 6110 and 6210 on the front surface of solar cell assemblies 2000.

Furthermore, the placement of the diode 2220 on the side of photovoltaic cell 3420 provides the further advantages that the diode is not in the thermal dissipation path of the photovoltaic cell 3420.

100641 The semiconductor structures 1800 and 2800 can advantageously be used as a carrier for a photovoltaic cell 6420 and 3420, which may otherwise not be stable alone for a subsequent pick-and-place process due to small thickness. In particular, the photovoltaic cell 6420 or 3420 can be placed, with the already mentioned pick-and-place method, or wafer bonded. The area ratio between the photovoltaic cell 6420 or 3420 and the semiconductor structures 1800 and 2800 can be in the range from 1.2 to 1, to 10 to 1, especially 2 to 1 to 4 to 1. This results in a semiconductor structure bigger than the photovoltaic cells 6420 and 3420, which gives place for the realization of the diode 6220 or 2220 and the electrical contact pad 6110, and facilitates the subsequent manufacturing steps, such as, for instance, a better handling is achieved for the pick-and-place process. For instance, gluing of the bigger semiconductor structures 1800 and 2800 on the heat sink 6100 is easier than gluing of the smaller photovoltaic cell 6420 or 3420, reducing the risk of damaging sensitive elements, such as, for instance, the cell.

Figure 3A:
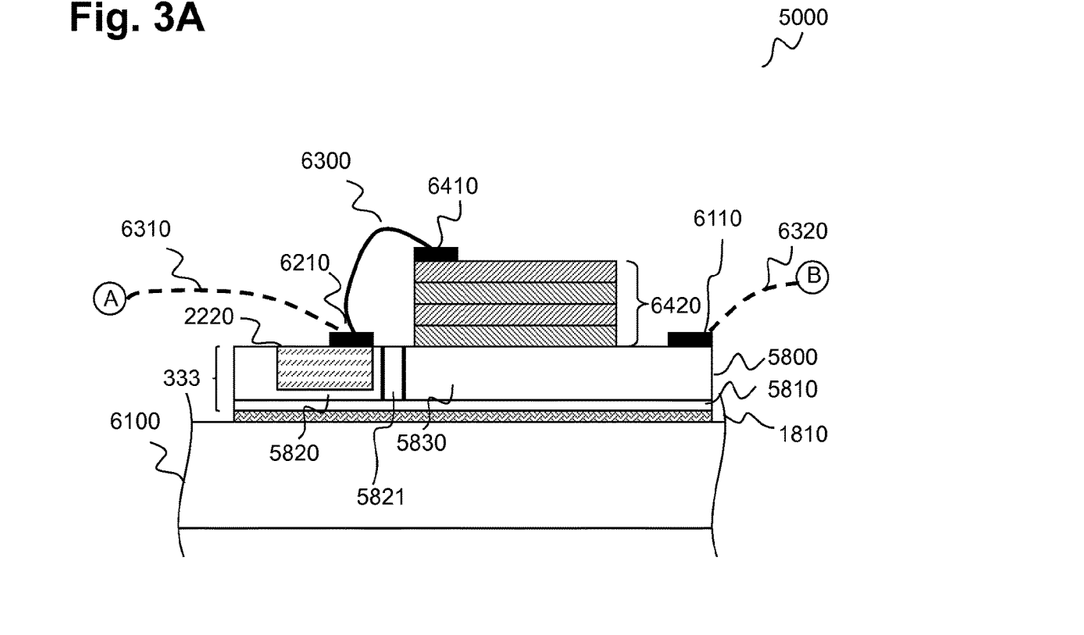
FIGS. 3A and 3B illustrate a solar cell assembly 5000 and a solar cell assembly structure 333 in accordance with further embodiments of this disclosure.
Figure 3B:
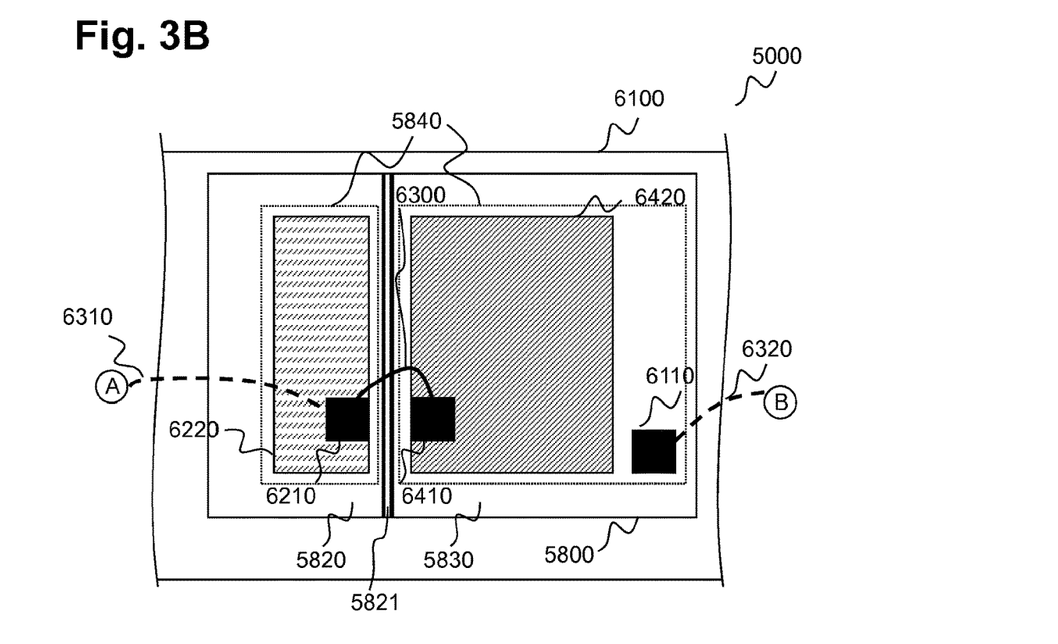

FIGS. 3A and 3B respectively illustrate a cross-sectional and a top view of solar cell assembly 5000 and a solar cell assembly structure 333 in accordance with further alternative embodiments of this disclosure. Here, the definition of the first and second semiconducting regions is in line with the definition provided for the embodiment of FIG. 2.

In particular, FIGS. 3A and 3B differ from the embodiment illustrated in FIG. 2 since the semiconductor structure 5800 is doped with different levels of doping, in at least two doping regions 5820 and 5830 and a separation is schematically illustrated by region 5821. Such a separation of the two doping regions 5820 and 5830 can, for instance, be obtained by locally restricting the diffusion doping by masking the respective regions. For instance, as seen in FIG. 3A, the regions 5820 and 5830 can be more restricted around the overlapping regions of the photovoltaic cell 6420 or the region of the diode 2220. This is schematically represented by the dashed lines in FIG. 3A surrounding the region of diode 2220, photovoltaic cell 6420, and electrical contact pad 6110. The region 5821 is less conductive than the other regions 5820 and 5830. The back contact between the diode 2220 and the photovoltaic cell 6420 is assured by an electrically conductive substrate 5810, further comprised in the semiconductor structure 5800 via the doped regions 5820 and 5830, which are electrically connected to the electrically conductive substrate 5810. The ensemble 5800 and 5810 could be, for instance, silicon (Si) on molybdenum (Mo) or tungsten (W) structure, the Mo or W assuring the back contact between the diode 2220, the photovoltaic cell 6420 and the electric contact pad 6110, whereas the Si layer can be easily processed in order to obtain doped regions 5820, 5830, 2220A-2200C, etc. This provides the advantage that a relatively low-cost substrate, provided by the thin layer of Si on the rather cheap Mo substrate, with good electrical conductivity, is obtained, the thin layer of Si having integrated functionalities like, for instance, the diode and the back contact of the cell and diode to the Mo substrate via highly doped regions 5820 and 5830. Further, the doped regions can be formed more localized, around the positions of the photovoltaic cell 6420, for instance. This is schematically shown by the dashed boundaries 5840 in FIG. 3B. The back contact is hereby assured by a much cheaper back substrate, whereas the functionalized front is obtained by semiconductor processing of semiconductor structure 5800.

More specifically, doped region 5820, which includes the above-defined second semiconducting region, and which can have a lower doping than doped region 5830, which includes the above-defined first semiconducting region, are electrically connected via the electrically conductive substrate 5810. As a result of such arrangement, it is possible to achieve a low reverse current for the diode 2220, while still having a low resistance path through the doped region 5830. The low reverse current is advantageous since, as the diode 2220 is reverse-biased during normal operation of the photovoltaic cell, it reduces losses by reducing the current flowing through the diode.

In some embodiments, the doping of doped region 5820 can be in the range from 5E15 to 5E17 $cm^{-3}$, while the doping of doped region 5830 can be in the range from 1E18 to 5E20 $cm^{-3}$. The materials used for doping of doped regions 5820 and/or 5830 can be B, Ga, P, Sb, As, In in case of Si or SiGe.

Although doped region 5830 is illustrated as extending to the bottom and to the borders of semiconductor structure 5800, this disclosure is not limited thereto. Alternatively, doped region 5830 could be shaped so as to provide a doped layer of a thickness in the range of 300 nm to 2 mm surrounding the photovoltaic cell 6420. Similarly, the doped region 5820 can also be locally restricted around diode 2220.

Although the alternative embodiment of FIGS. 3A and 3B have been realized with reference to the embodiment of FIG. 2, this disclosure is not limited thereto. Alternatively, or in addition, the embodiment of FIGS. 3A and 3B can also be realized in combination with the embodiment of FIGS. 1A, 1B, and 2A-2C.

All of the contacts mentioned in the above-described embodiments can be composed of materials like Au, Ag, Ti, Pd, Pt, Zn, Ge, Ni, etc., or, more generally, can be plated to achieve better conductivity.

Any of the doped regions mentioned in the above-described embodiments can be realized via diffusion doping and/or epitaxial growth.

Moreover, it will be clear to those skilled in the art that the n-p polarities described above can be reciprocally inverted, while still obtaining the same advantageous effects as far as facing of regions with the same doping polarity is concerned.

It will be further clear to those skilled in the art that the different embodiments are examples only of the disclosure and that features from the embodiments can be combined in several advantageous ways, in accordance with the embodiments.

The invention claimed is:

1. A solar cell assembly structure, comprising:
   a concentrator photovoltaic cell structure;
   a diode; and
   a semiconductor structure, comprising:
      a first conductive region, the concentrator photovoltaic cell structure disposed on at least a part of the first conductive region, the first conductive region being doped n-type or p-type with a dopant concentration greater than 1E18 $cm^{-3}$; and
      a second conductive region doped with the same type of dopant as the first conductive region and with a lower concentration as the first conductive region, the diode disposed within or on the second conductive region; and
      an electrically conductive substrate electrically connecting the first conducting region and the second conducting region and providing a back contact between the diode and the photovoltaic cell; and
      wherein the first and second conductive regions do not vertically overlap with one another and are arranged in the same horizontal plane.

2. The solar cell assembly structure according to claim 1, further comprising an electrical contact pad in electrical contact with each of the diode and the concentrator photovoltaic cell structure.

3. The solar cell assembly structure according to claim 2, wherein the first and second conductive regions comprise a semiconductor material.

4. The solar cell assembly structure according to claim 3, wherein the electrically conductive substrate comprises a metal.

5. The solar cell assembly structure according to claim 1, wherein the diode comprises a first doped region and a second doped region, and wherein the first and second doped regions have different polarity.

6. The solar cell assembly structure according to claim 5, wherein the polarity of the diode is p-type on n-type, with a positive pole contacting a front contact and a negative pole contacting the first conductive region.

7. The solar cell assembly structure according to claim 6, wherein the first conducting region of the semiconductor structure has the same type of doping as the second doped region of the diode.

8. The solar cell assembly structure according to claim 7, wherein the first and/or second doped regions are realized via diffusion doping and/or epitaxial growth.

9. A solar cell assembly comprising a plurality of solar cell assembly structures according to claim 7 mounted on a heat sink.

10. The solar cell assembly according to claim 9, wherein the concentrator photovoltaic cell structure and the diode of each solar cell assembly structure of the plurality are bonded on the first and second conductive regions, respectively, using molecular or direct bonding.

11. The solar cell assembly according to claim 10, wherein the diode is connected in an antiparallel manner to the concentrator photovoltaic cell structure.

12. The solar cell assembly according to claim 11, wherein the concentrator photovoltaic cell structure is a multi-junction cell made of a III-V compound semiconductor, the III-V compound semiconductor selected from the group consisting of InGaAs, InGaAsP, GaAs, and InGaP.

13. The solar cell assembly according to claim 12, wherein the concentrator photovoltaic cell structure has a thickness lower than 10 μm.

14. The solar cell assembly according to claim 13, wherein the concentrator photovoltaic cell structure comprises a bottom layer made of p-doped material and the first conductive region is p-doped, and molecular bonding is realized between the p-doped bottom layer and the first conductive region, and is a p-p bonding, type.

15. The solar cell assembly according to claim 13, wherein the concentrator photovoltaic cell structure comprises a top layer made of n-doped material and a bottom layer made of p-doped material and further comprises a p-n tunnel diode realized on the bottom layer, the first conductive region is n-doped, and molecular bonding is realized between a free n-doped face of the tunnel diode and the first conductive region, and is an n-n bonding type.

16. The solar cell assembly according to claim 13, with an area ratio between the solar cell assembly, structure and the concentrator photovoltaic cell structure in the range from 1.2 to 1 up to 10 to 1.

17. The solar cell assembly according to claim 13, wherein the solar cell assembly structures of the plurality are mounted on the heat sink via an adhesive.

18. A plurality of solar cell assembly structures according to claim 8, wherein the plurality of solar cell assembly structures is realized on a wafer with a diameter of 2 inches, 4 inches, 6 inches, 8 inches, 11 inches, or 400 cm and made of silicon or silicon on molybdenum.

19. The solar cell assembly structure according to claim 2, wherein the first and second conductive regions comprise Si.

20. The solar cell assembly structure according to claim 2, wherein the first and second conductive regions comprise Ge.

21. The solar cell assembly structure according to claim 2, wherein the first and second conductive regions comprise SiGe.

22. The solar cell assembly structure according to claim 3, wherein the electrically conductive substrate comprises molybdenum.

23. The solar cell assembly structure according to claim 3, wherein the electrically conductive substrate comprises tungsten.

24. The solar cell assembly according to claim 9, wherein the concentrator photovoltaic cell structure and the diode are bonded on the first and second conductive regions, respectively, using thermal compression bonding.

25. The solar cell assembly according to claim 9, wherein the concentrator photovoltaic cell structure and the diode are bonded on the first and second conductive regions, respectively, using metallic bonding.

26. The solar cell assembly according to claim 16, with an area ratio between the solar cell assembly structure and the concentrator photovoltaic cell structure in the range from 2 to 1 up to 4 to 1.

* * * * *